US012444578B2

(12) United States Patent
Kim et al.

(10) Patent No.: US 12,444,578 B2
(45) Date of Patent: Oct. 14, 2025

(54) METHOD FOR PROTECTING APPARATUS FROM ETCHING SUBSTANCES AND METHOD FOR FORMING OXIDE FILM

(71) Applicant: TES CO., LTD, Yongin-si (KR)

(72) Inventors: Kwang-Ki Kim, Yongin-si (KR); Bi-O Lim, Yongin-si (KR)

(73) Assignee: TES CO., LTD, Yongin-si (KR)

( * ) Notice: Subject to any disclaimer, the term of this patent is extended or adjusted under 35 U.S.C. 154(b) by 427 days.

(21) Appl. No.: 18/025,572

(22) PCT Filed: Jul. 26, 2021

(86) PCT No.: PCT/KR2021/009671
§ 371 (c)(1),
(2) Date: Mar. 9, 2023

(87) PCT Pub. No.: WO2022/055124
PCT Pub. Date: Mar. 17, 2022

(65) Prior Publication Data

US 2023/0343562 A1 Oct. 26, 2023

(30) Foreign Application Priority Data

Sep. 10, 2020 (KR) ........................ 10-2020-0115975

(51) Int. Cl.
*H01J 37/32* (2006.01)
*C23C 16/40* (2006.01)

(52) U.S. Cl.
CPC ...... *H01J 37/32495* (2013.01); *C23C 16/401* (2013.01); *H01J 37/32862* (2013.01); *H01J 2237/3321* (2013.01)

(58) Field of Classification Search
CPC .......... H01J 37/32477; H01J 37/32496; C23C 16/401
See application file for complete search history.

(56) References Cited

U.S. PATENT DOCUMENTS 6,121,161 A * 9/2000 Rossman ............ C23C 16/4401 438/783
6,899,785 B2 * 5/2005 Dutra ................ H01J 37/32477 156/345.35

(Continued)

FOREIGN PATENT DOCUMENTS

JP 61-94235 * 5/1986 ............... G11B 5/84
JP 2007-305981 * 11/2007 ............. H01L 21/76

(Continued)

OTHER PUBLICATIONS

Kim, Min Su, et al., "Effect of seasoning-layer stress on fluorine diffusion". AIP Advances 10, 085103 (2020) pp. 1-7.*

(Continued)

*Primary Examiner* — Bret P Chen
(74) *Attorney, Agent, or Firm* — Paratus Law Group, PLLC

(57) ABSTRACT

There is provided a method of protecting an apparatus from an etching material. The method includes: (a) forming a protective layer on an exposed surface of an apparatus; (b) forming a seasoning layer on the protective layer; (c) performing a deposition process on a wafer that is inserted into the apparatus in which the protective layer and the seasoning layer are formed; (d) removing a deposition film on the seasoning layer of the apparatus in the deposition process and the seasoning layer, with a first etching material; and (e) removing the protective layer, with a second etching material.

9 Claims, 8 Drawing Sheets

(56) References Cited

U.S. PATENT DOCUMENTS

| | | | | |
|---|---|---|---|---|
| 7,109,114 | B2 * | 9/2006 | Chen | C23C 16/4404 438/513 |
| 9,017,487 | B2 * | 4/2015 | Cheng | C23C 14/34 134/4 |
| 9,711,365 | B2 * | 7/2017 | Joseph | H01L 21/30655 |
| 2003/0211735 | A1 * | 11/2003 | Rossman | C23C 30/00 257/E21.279 |
| 2006/0189171 | A1 * | 8/2006 | Chua | C23C 16/4404 257/E21.279 |
| 2008/0216302 | A1 * | 9/2008 | Cheung | H01J 37/32477 427/430.1 |
| 2008/0216958 | A1 * | 9/2008 | Goto | C23C 18/1216 156/345.35 |
| 2019/0271076 | A1 | 9/2019 | Fenwick et al. | |

FOREIGN PATENT DOCUMENTS

| | | | | | |
|---|---|---|---|---|---|
| JP | 2010-205854 | A | | 9/2010 | |
| KR | 1999-006869 | | * | 1/1999 | H01L 21/205 |
| KR | 10-2004-0081150 | A | | 9/2004 | |
| KR | 10-0751996 | | * | 8/2007 | H01L 21/311 |
| KR | 2008-0048430 | | * | 6/2008 | H01L 21/02 |
| KR | 10-2008-0092273 | | * | 10/2008 | H01L 21/205 |
| KR | 10-1614273 | B1 | | 4/2016 | |
| KR | 10-2017-0009843 | A | | 1/2017 | |
| KR | 10-2017-0134234 | A | | 12/2017 | |
| KR | 10-2018-0005756 | A | | 1/2018 | |
| KR | 10-2020-0090267 | A | | 7/2020 | |
| TW | 460943 | | * | 4/1987 | |
| WO | WO 2020/081303 | | * | 4/2020 | H01L 21/02 |

OTHER PUBLICATIONS

Baek, Kye Hyun, et al., "Systematic procedure to optimize chamber seasoning conditions with optical emission spectroscopy in plasma etching". J. Vac. Sci. Technol. B 32, 022203 (2014) pp. 1-6.*

Agarwal, Ankur, et al., "Seasoning of plasma etching reactors: Ion energy distributions to walls and real-time and run-to-run control strategies". J. Vac. Sci. Technol. A 26, 498-512 (2008) pp. 498-512.*

Korean Office Action for related KR Application No. 10-2020-0115975 mailed May 8, 2025 from Korean Intellectual Property Office.

International Search Report for PCT/KR2021/009671 mailed Nov. 10, 2021 from Korean Intellectual Property Office.

* cited by examiner

METHOD FOR PROTECTING APPARATUS FROM ETCHING SUBSTANCES AND METHOD FOR FORMING OXIDE FILM

CROSS-REFERENCE TO PRIOR APPLICATIONS

This application is a National Stage Patent Application of PCT International Patent Application No. PCT/KR2021/009671 (filed on Jul. 26, 2021) under 35 U.S.C. § 371, which claims priority to Korean Patent Application No. 10-2020-0115975 (filed on Sep. 10, 2020), which are all hereby incorporated by reference in their entirety.

BACKGROUND

The present disclosure relates to a method of protecting an apparatus from an etching material. In particular, the present disclosure relates to a method of protecting an apparatus comprising aluminum from an etching material comprising fluorine.

Additionally, the present disclosure relates to a method of forming an oxide film.

Elements such as a semiconductor element, a display element and the like comprise various types of layers such as a semiconductor layer, a metal layer, an oxide layer, a nitride layer and the like. Among the layers, the oxide layer is widely used for a semiconductor material, an erosion prevention layer and the like. In particular, a small-sized and high-integrated semiconductor element requires finer patterns. To embody finer patterns, a high-temperature oxide layer having high resistance against thermal deformation is required.

Additionally, an oxide film can be formed based on a deposition process, in an apparatus comprising various types of parts such as a chamber, a shower head, a heater and the like. After the deposition process is completed, a substrate on which the oxide layer is formed comes out of the chamber, and then a cleaning process is performed. In the cleaning process, the oxide layer formed on the inner surface of the chamber, the surface of the shower head, the surface of the heater and the like is removed with a cleaning agent comprising an etching material. However, the cleaning agent often reacts directly with components of the chamber, the shower head, the heater and the like, not stopping at the oxide layer. For example, in the case where a cleaning agent comprising nitrogen trifluoride ($NF_3$) is used to perform the cleaning process, after the high-temperature oxide layer is formed, fluorine-based by-products can react with aluminum (Al) or aluminum alloy constituting the chamber, the heater and the like and generate aluminum fluoride ($AlF_3$) powder. The generated aluminum fluoride can contaminate or damage the chamber, the heater and the like.

To solve the above problems, in the case of an apparatus performing a high-temperature oxidation process, a protective layer is ordinarily formed on the inner wall of the chamber or the surface of the heater.

As a patent document, KR Patent Publication No. 10-2004-0081150 (hereafter, patent document 1), which was published on Sep. 20, 2004, suggests heating a coating material that comprises at least one material selected from a group consisting of aluminum fluoride and magnesium fluoride, such that the coating material falls into a semi-liquid state, and depositing the heated coating material on the aluminum surface to form a protective layer.

However, the method of forming a protective layer in patent document 1 is hardly performed right before or right after processing such as a process of forming an oxide, and when the coating material separates, an apparatus needs to be disassembled, and a protective layer needs to be formed again in an additional place.

SUMMARY

The objective of the present disclosure is to provide a method of protecting an apparatus from an etching material that can prevent the etching material from contaminating or damaging the apparatus during processing.

The objective of the present disclosure is to provide a method of forming an oxide film, such that contact of a fluorine-based etching material with the exposed surface of an apparatus comprising Al is suppressed during etching and cleaning processes.

A method of protecting an apparatus from an etching material, according to the present, disclosure comprises (a) forming a protective layer on an exposed surface of an apparatus; (b) forming a seasoning layer on the protective layer; (c) performing a deposition process comprising loading a wafer into the apparatus in which the protective layer and the seasoning layer are formed, depositing in the apparatus, and unloading the wafer from the apparatus; (d) removing a deposition film on the seasoning layer of the apparatus in the deposition process and the seasoning layer, with a first etching material; and (e) removing the protective layer, with a second etching material.

The seasoning layer is a layer that has a high etch rate with respect to the first etching material, and the protective layer is a layer that has a high etch rate with respect to a second etching material. According to the present disclosure, in the step (d), the protective layer having a low etch rate with respect to the first etching material may suppress contact of the first etching material with the exposed surface of the apparatus. Accordingly, the apparatus may be protected from the etching material.

The etch rate of the protective layer with respect to the first etching material may account for one fourth or less of the etch rate of the seasoning layer with respect to the first etching material. When the etch rate of the protective layer with respect to the first etching material accounts for one fourth or less of the etch rate of the seasoning layer with respect to the first etching material, a greater effect in the protection of the apparatus may be produced.

The protective layer may be a layer having compressive stress. The layer having compressive stress may have a low etch rate with respect to the first etching material, thereby producing a great effect in the protection of an apparatus.

The wafer processing in the step (c) may comprise forming an oxide film, and the seasoning layer may comprise an oxide. In the case where the wafer processing is forming an oxide film, the seasoning layer is formed with the same sort of the oxide film, such that the oxide film formed on the seasoning layer, and the seasoning layer are removed together, in one process, at a time of wafer processing.

The deposition process may be performed twice or greater. In the case where the protective layer and the seasoning layer remain based on the deposition process, the deposition process may also be performed to another wafer, and then an etching/cleaning process may proceed, thereby ensuring improvement in productivity. In another embodiment, the step of forming a seasoning layer to the step of removing the seasoning layer may be performed twice or greater.

A method of forming an oxide film according to the present disclosure comprises (a) forming a protective layer on an exposed surface of an apparatus comprising aluminum; (b) forming a seasoning layer on the protective layer; (c) performing a oxide film deposition process comprising loading a wafer into the apparatus in which the protective layer and the seasoning layer are formed, depositing in the apparatus, and unloading the wafer from the apparatus; (d) removing the oxide film formed on the seasoning layer of the apparatus in the deposition process and the seasoning layer, with a fluorine-based etching material; and (e) removing the protective layer, with a non-fluorine-based etching material.

In the above configuration, the protective layer having a low etch rate with respect to the fluorine-based etching material may suppress contact of the fluorine-based etching material with the exposed surface of the apparatus, even when cleaning is performed with fluorine-based etching material, thereby protecting the apparatus from the etching material.

The etch rate of the protective layer with respect to the fluorine-based etching material may account for one fourth or less of the etch rate of the seasoning layer with respect to the fluorine-based etching material.

The protective layer may be selected from an amorphous carbon layer, a boron-doped carbon layer, and a tungsten-doped carbon layer.

The protective layer may be a layer having compressive stress.

The seasoning layer may comprise an oxide.

The above-described step (c) may be performed twice or greater. In another example, the above-described steps (b), (c) and (d) may be performed twice or greater.

In a method of protecting an apparatus from an etching material according to the present disclosure, a coating layer, which has a low etch rate with respect to a specific etching material such as a fluorine-based etching material, is formed on the exposed surface of an apparatus such as a reaction chamber, a substrate heating device, a shower head and the like, during processing, to suppress a reaction between the etching material, and materials constituting the apparatus.

For example, in the case where cleaning is performed to a reaction chamber or substrate heating device made of Al, with a fluorine-based cleaning material such as $NF_3$, after a high-temperature oxide film is formed, fluorine-by-products ($F_x$) are likely to react with Al constituting the reaction chamber and the substrate heating device and produce aluminum fluoride ($AlF_3$) powder. However, in the present disclosure, since etching/cleaning processes are performed in the state where a coating layer, having a low etch rate with respect to a fluorine-based cleaning material, is formed, the above problems can be solved.

DETAILED DESCRIPTION

Advantages and features in the present disclosure and methods for ensuring the same can be clearly understood from the embodiments that are described hereafter with reference to the accompanying drawings. The subject matter of the present disclosure, however, can be embodied in various different forms, and should not be construed as being limited to the embodiments set forth herein. Rather, the embodiments are provided as examples so that the present disclosure can be thorough and complete and that the scope of the disclosure can be fully conveyed to one having ordinary skill in the art. The subject matter of the present disclosure is to be defined only according to the scope of the appended claims.

Hereafter, a method of protecting an apparatus from an etching material and a method of forming an oxide film according to the present disclosure, with reference to the accompanying drawings.

Figure 1:
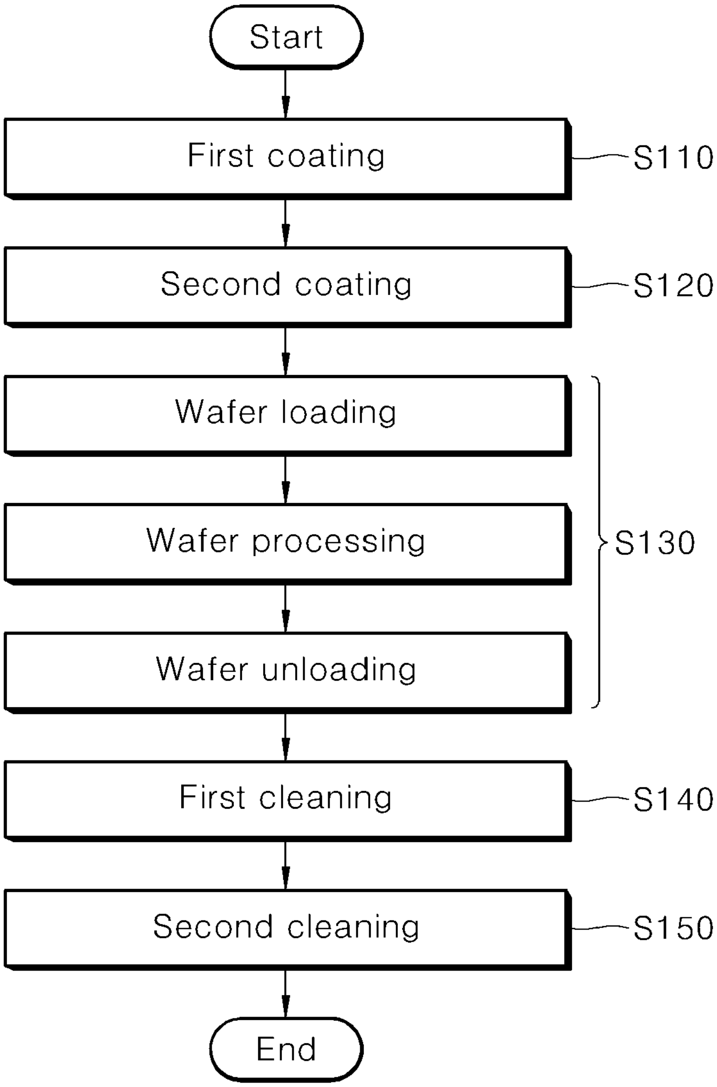
FIG. 1 is a schematic view showing a method of protecting an apparatus from an etching material according to the present disclosure.

FIG. 1 is a schematic view showing a method of protecting an apparatus from an etching material according to the present disclosure.

Referring to FIG. 1, the method of protecting an apparatus from an etching material, according to the present disclosure, comprises the steps of first coating (S110), second coating (S120), performing a unit process (S130), first cleaning (S140) and second cleaning (S150).

The step of first coating (S110) involves forming a protective layer on the exposed surface of an apparatus.

The apparatus is for processing a wafer. The apparatus in the present disclosure may be a finished product where various types of parts are assembled, such as a plasma-enhanced chemical vapor deposition (PECVD) apparatus, or may be various types of parts that are included in a finished product, i.e., a reaction chamber, a substrate heating device, a shower head and the like.

A protective layer may be a material that has a low etch rate with respect to a first cleaning material that is used in the step of first cleaning described hereafter. The protective layer suppresses direct contact of the first cleaning material or the by-products thereof with the apparatus in the step of first cleaning, thanks to its low etch rate. For example, in the case where the first cleaning material is a fluorine-based etching material such as nitrogen trifluoride ($NF_3$), the protective layer may be an amorphous carbon layer. A fluorine-based etching material is widely used for etching/cleaning an etching material. If the protective layer is not provided or is made of a material that is easily etched by a fluorine-based etching material or the by-products thereof may contact the chamber or the substrate heating device, in a cleaning process based on the fluorine-based etching material. The contact of the fluorine containing material with the apparatus causes the contamination of the apparatus or contributes to the generation of new particles which is caused by a chemical reaction between the fluorine containing material and the materials constituting the apparatus. However, in the present disclosure, a coating layer having a low etch rate with respect to the first cleaning material is formed on the exposed surface of the apparatus, thereby making it possible to solve the problems including the contamination of the apparatus or the formation of the new particles, and the like, described above.

In particular, the protective layer is formed before the unit process such as the formation of an oxide film, and the protective layer is removed after the unit process, in the present disclosure. Accordingly, there is no need to disassemble the apparatus in the case where the protective layer is formed or removed, and since the apparatus does not need to be disassembled, a change in the settings of the apparatus is not caused because of the reassembly of the apparatus.

Additionally, the thickness of the coating layer on the inner wall of the reaction chamber may differ slightly, depending on the environment in the reaction chamber. The thickness of the coating layer is determined based on the amount of reaction gas that reaches the inner wall in a deposition process. The coating layer on a portion of the inner wall, which is reached by a large amount of reaction gas, may be relatively thick, and the coating layer on a portion of the inner wall, which is reached by a small amount of reaction gas, may be relatively thin. The amount of reaction gas reaching the relatively thick portion of the inner wall is proportional to the amount of etch gas reaching the inner wall. In the present disclosure, since the protective layer, and a seasoning layer described hereafter are formed in the deposition process and then the cleaning process is performed, the over etching and the like may be suppressed in a specific portion of the inner wall of the chamber.

Preferably, the etch rate of the protective layer with respect to the first etching material accounts for one fourth or less of the etch rate of the seasoning layer with respect to the first etching material. The effect in the protection of the apparatus may be greater at the etch rate of the protective layer with respect to the first etching material, accounting for ¼ or greater of the etch rate of the seasoning layer with respect to the first etching material than the etch rate of the protective layer with respect to the first etching material, accounting for ¼ or less of the etch rate of the seasoning layer with respect to the first etching material.

Additionally, the protective layer may be a layer having compressive stress. The layer having compressive stress is denser than a layer having tensile stress. Thus, the layer having compressive stress shows a lower etch rate with respect to the first etching material than the layer having tensile stress. Thus, the layer having compressive stress may produce a greater effect in the protection of the apparatus than the layer having tensile stress.

The step of forming a seasoning layer (S120) involves forming a seasoning layer on the protective layer.

The seasoning layer prevents the exposure of the protective layer in the unit process. For example, in the case where an amorphous carbon layer is formed on the inner wall of the chamber, carbon particles may flake off from the amorphous carbon layer, and a wafer may be contaminated, in the step of forming an oxide film. However, in the case where the seasoning layer is formed, the above-described risk can be avoided. The seasoning layer may be made of a material that has a high etch rate with respect to the first etching material. For example, in the case where the first etching material is nitrogen trifluoride ($NF_3$), the seasoning layer may be formed of an oxide.

Additionally, the seasoning layer is preferably formed into the layer of the same sort as the deposition film that is formed on the seasoning layer by wafer processing. For example, in the case where a silicon oxide film is formed in the unit process, the seasoning layer is also a silicon oxide layer, preferably. At this time, the deposition film and the seasoning layer may be removed together with the first etching material, in the step of first cleaning.

Then the step of performing a unit process (S130) involves performing a deposition process on a wafer inserted into the apparatus where the protective layer and the seasoning layer are formed. Specifically, the step of performing a unit process (S130) involves performing a unit process comprising loading and depositing a wafer in the apparatus where the protective layer and the seasoning layer are formed, and unloading the wafer from the apparatus.

The step of processing a wafer may involve various types of deposition processes such as a process of forming an oxide film, a process of forming a nitride layer and the like.

The unit process may be performed twice or more when necessary. In the case where the protective layer and the seasoning layer remain after a unit process for one wafer, a unit process may also be performed for another wafer, and then the step of etching/cleaning may be performed. As a result, productivity can be improved. In another example, the step of forming a seasoning layer (S120), the step of performing a unit process (S130) and a step of first cleaning (S140) described hereafter may be performed twice or more. In the case where the protective layer remains, a cycle in which a seasoning layer is formed, a unit process is performed and the seasoning layer is removed may be performed a plurality of times.

The step of first cleaning (S140) involves removing the seasoning layer with the first etching material. The step of second cleaning (S150) involves removing the protective layer with a second etching material. In the step of first cleaning (S140), the deposition film that is formed on the seasoning layer in the unit process is also removed.

The seasoning layer is a layer that has a high etch rate with respect to the first etching material, and the protective layer is a layer that has a high etch rate with respect to the second etching material and has a low etch rate with respect to the first etching material.

In the present embodiment, the protective layer having a low etch rate with respect to the first etching material may help to suppress contact of the first etching material with the exposed surface of the apparatus in the step of first cleaning (S140). Accordingly, the apparatus may be protected from the etching material.

For example, in the case where the seasoning layer is a silicon oxide layer, the first etching material may be $NF_3$, the protective layer may be an amorphous carbon layer that has a relatively low etch rate with respect to $NF_3$, and the second etching material may be an oxygen containing etching material that has a high etch rate with respect to an amorphous carbon layer.

In another example, in the case where the seasoning layer is a silicon oxide layer, the first etching material may be HF, the protective layer may be an amorphous carbon layer that has a relatively low etch rate with respect to HF, and the second etching material may be an oxygen containing etching material that has a high etch rate with respect to an amorphous carbon layer.

Hereafter, a method of forming an oxide film according to the present disclosure is described with reference to FIGS. 2 to 8.

Figure 2:
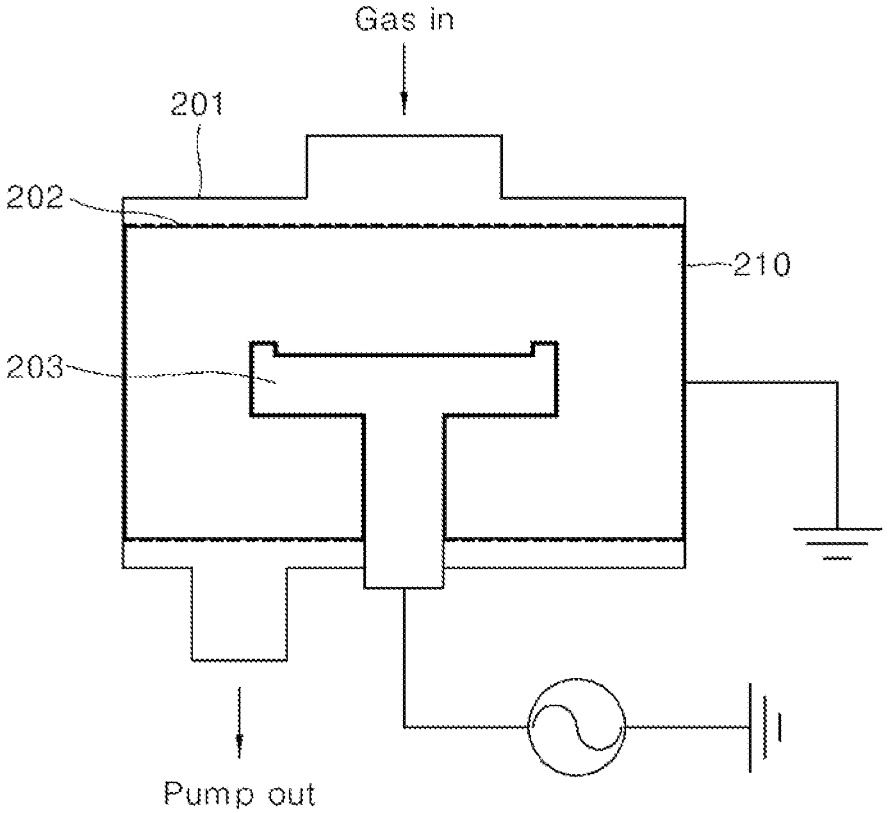
FIG. 2 is a view showing that a protective layer is formed on the exposed surface of an apparatus, for example.

FIG. 2 is a view showing that a protective layer is formed on the exposed surface of an apparatus, for example.

As illustrated in FIG. 2, the method of forming an oxide film according to the present disclosure involves forming a protective layer on the exposed surface of an apparatus containing aluminum, first.

FIG. 2 shows a reaction chamber 201, a shower head 202 and a substrate heating device 203 as an apparatus. At least one of these devices may be made of a material comprising aluminum Al. The reaction chamber 201 connects to a reaction gas supply to which reaction gas for performing the unit process and reaction gas for forming the protective layer and the seasoning layer are supplied. Additionally, the reaction chamber 201 may connect to a pumping device for discharging gas in the reaction chamber. Further, at least one of the reaction chamber 201, the substrate heating device 203 and the shower head 202 may serve as an electrode. In the illustrative embodiment, a power supply device is disposed at the lower end of the reaction chamber 201, and supplies power to the substrate heating device 203, but is not limited. The power supply device may be disposed at the upper end of the reaction chamber and supply power to the shower head 202.

Referring to FIG. 2, the inner surface of the reaction chamber 201, the surface of the shower head 202 and the surface of the substrate heating device 203 are exposed. The protective layer 210 is formed on the exposed portions. The first etching material may be $NF_3$, and the protective layer may be an amorphous carbon layer having a relative low etch rate with respective to $NF_3$, to remove an oxide film on the inner wall and the like of the chamber, which is formed in a step of forming a silicon oxide film, as described above. Additionally, an amorphous carbon layer has an excellent adhesive force of adhering to a reaction chamber and an oxide film, rarely affects wafer processing, and is readily used as a protective layer. Further, the amorphous carbon layer may be etched/cleaned by simple oxygen plasma.

As the etch rate of the protective layer 210 with respect to a fluorine-based etching material decreases, the effect in the protection of an apparatus increases. In this respect, the etch rate of the protective layer 210 with respect to a fluorine-based etching material may account for one fourth or less, preferably one tenth or less, more preferably one twentieth or less of the etch rate of the seasoning layer with respect to a fluorine-based etching material.

The protective layer 210 may be selected from an amorphous carbon layer, a boron-doped carbon layer, and a tungsten-doped carbon layer. These carbon layers may exhibit a very low etch rate with respect to a fluorine-based etching material.

Additionally, the protective layer 210 may be a layer having compressive stress. In the case where a thin layer has compressive stress rather than tensile stress, the thin layer may be a dense layer. Thus, the etch rate of the protective layer 210 with respect to a fluorine-based etching material may become very low. For example, the etch rate of an amorphous carbon layer having compressive stress is much lower than that of an amorphous carbon layer having tensile stress, with respect to nitrogen trifluoride.

Figure 3:
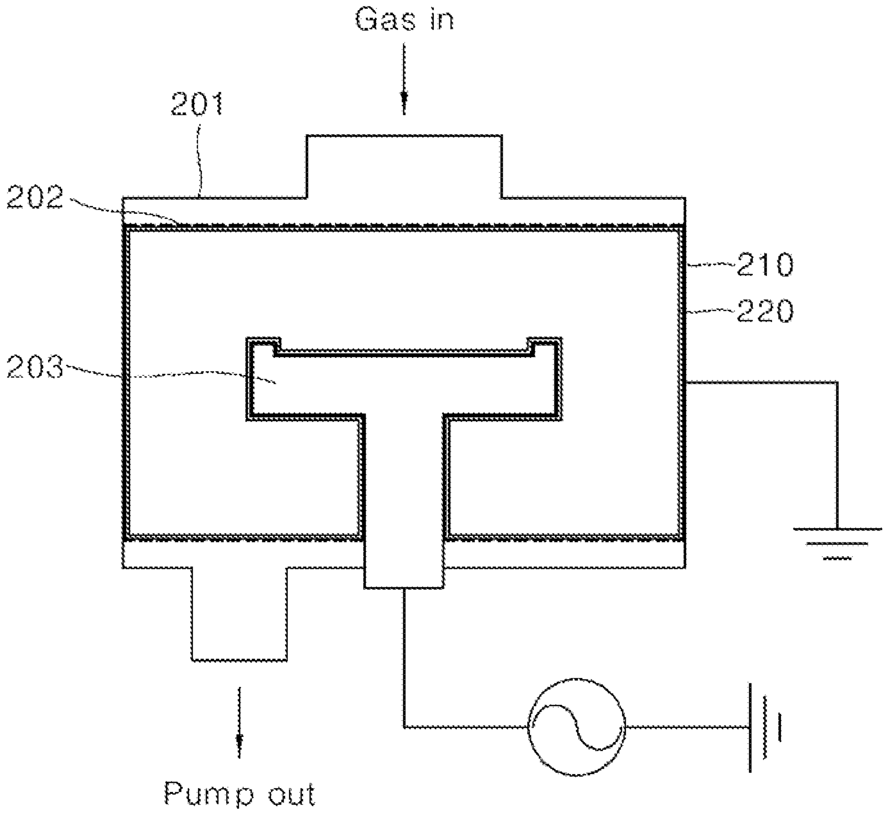
FIG. 3 is a view showing that a seasoning layer is formed on the protective layer of the apparatus, for example.

FIG. 3 is a view showing that a seasoning layer is formed on the protective layer of the apparatus, for example.

Then a seasoning layer 220 is formed on the protective layer 210, as illustrated in FIG. 3. If the unit process is a process of forming a silicon oxide film or a process of forming a metal oxide film, the seasoning layer 220 may also be an oxide layer of the same sort.

Figure 4:
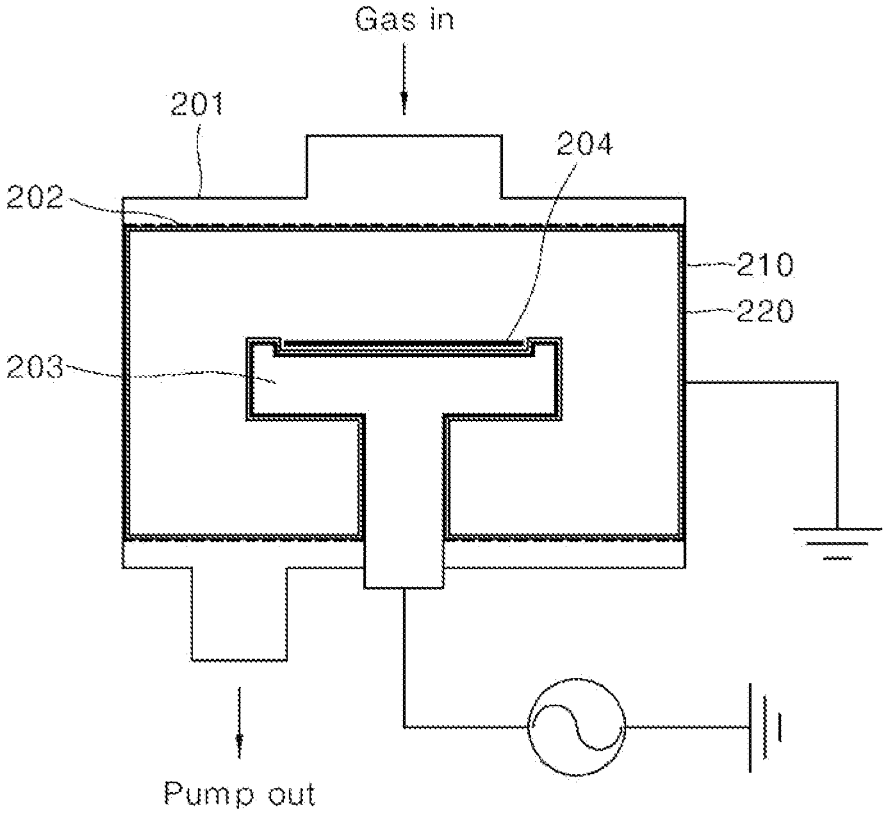
FIG. 4 is a view showing that a wafer is loaded in a reaction chamber where the seasoning layer is formed, for example.

Then a wafer 204 is loaded on the substrate heating device 203 in the reaction chamber 201, in the state where the protective layer 210 and the seasoning layer 220 are formed on the exposed surface of the devices, as illustrated in FIG. 4.

Figure 5:
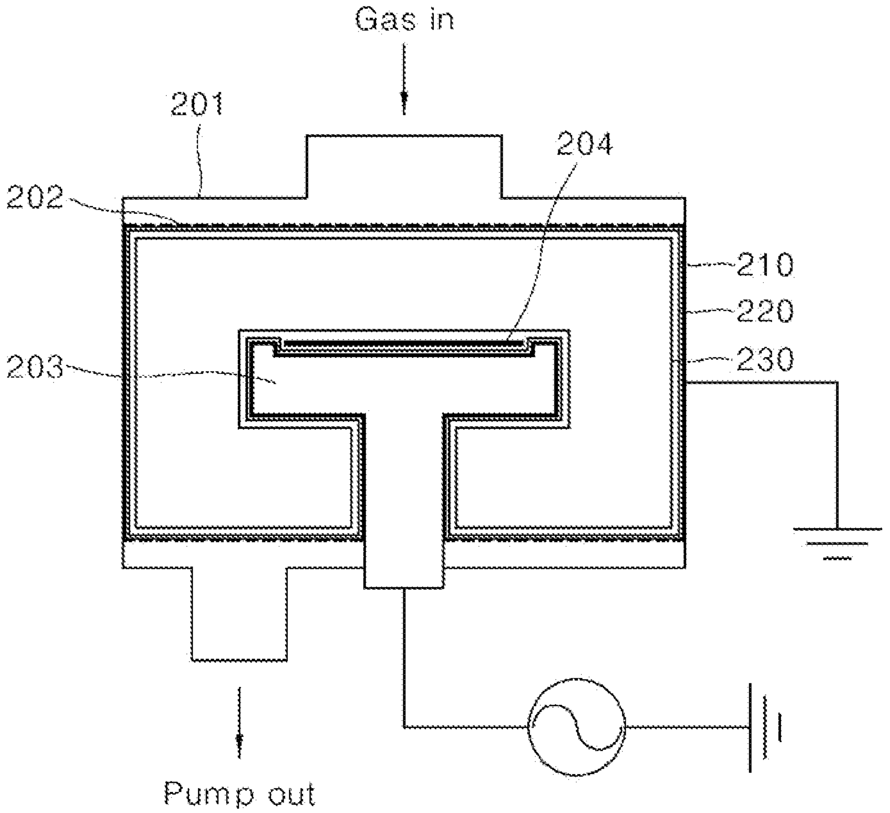
FIG. 5 is a view showing that an oxide film is formed on the wafer and the seasoning layer of the apparatus, for example.

Then an oxide film 230 to be formed is formed on the wafer 204, as illustrated in FIG. 5. At this time, an oxide film is also formed on the seasoning layer 220.

For example, the step of forming an oxide film can be performed at 400° C. or greater. The step of first cleaning may also be performed at 400° C. or greater.

Figure 6:
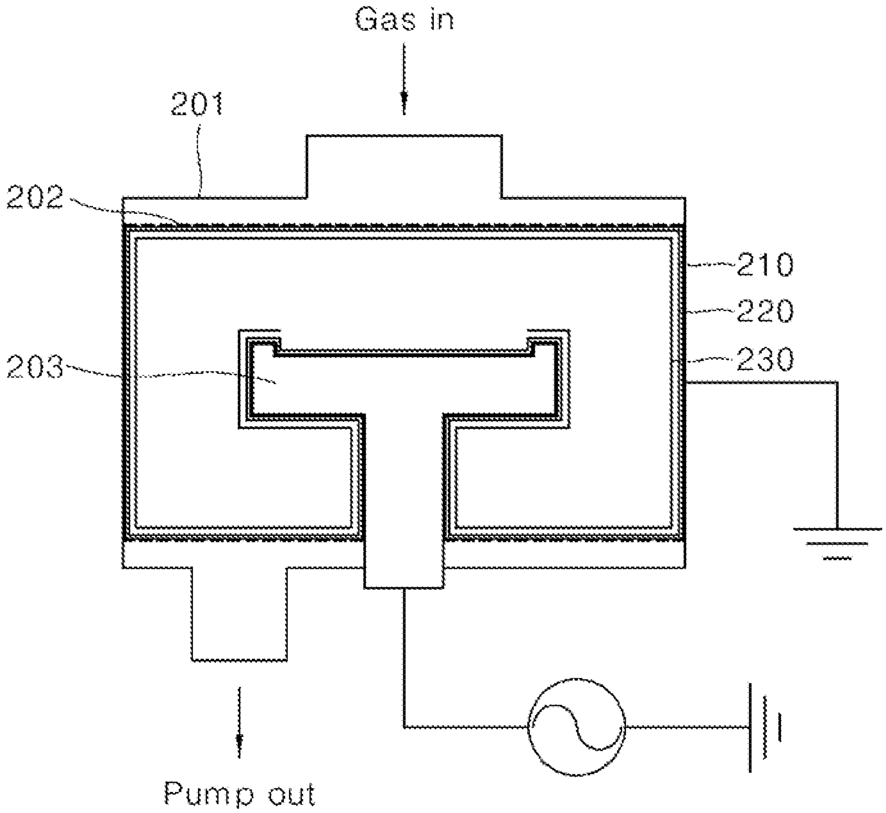
FIG. 6 is a view showing that the wafer is unloaded from the reaction chamber, after the oxide film is formed, for example.

After the oxide film is formed, the wafer 204 is unloaded from the reaction chamber 201, as illustrated in FIG. 6.

The unit process comprising the steps of loading a wafer, forming an oxide film and unloading the wafer may be performed only for one wafer, and when necessary, may also be performed for another wafer.

Figure 7:
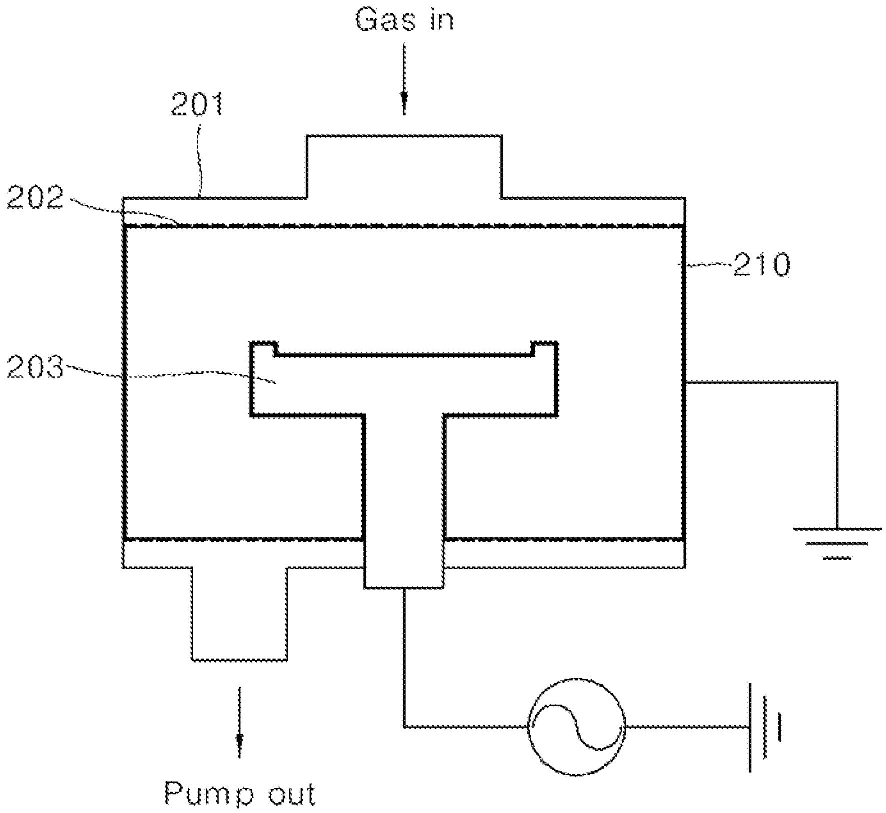
FIG. 7 is a view showing that the oxide film and the seasoning layer are removed by a first etching material, for example.

Then the step of first cleaning is performed to remove the oxide film 230 and the seasoning layer 220 with a fluorine-based etching material, as illustrated in FIG. 7.

In the step of first cleaning, $NF_3$, HF and the like may be used as a fluorine-based etching material. The present disclosure suggests a protective layer such as an amorphous carbon layer having a low etch rate with respect to a fluorine-based etching material. Accordingly, the fluorine-based etching material's contact with the exposed surface of an apparatus, e.g., the inner surface of the reaction chamber and the surface of the substrate heating device, may be suppressed, in the step of first cleaning. Thus, the apparatus may be protected from the etching material.

Figure 8:
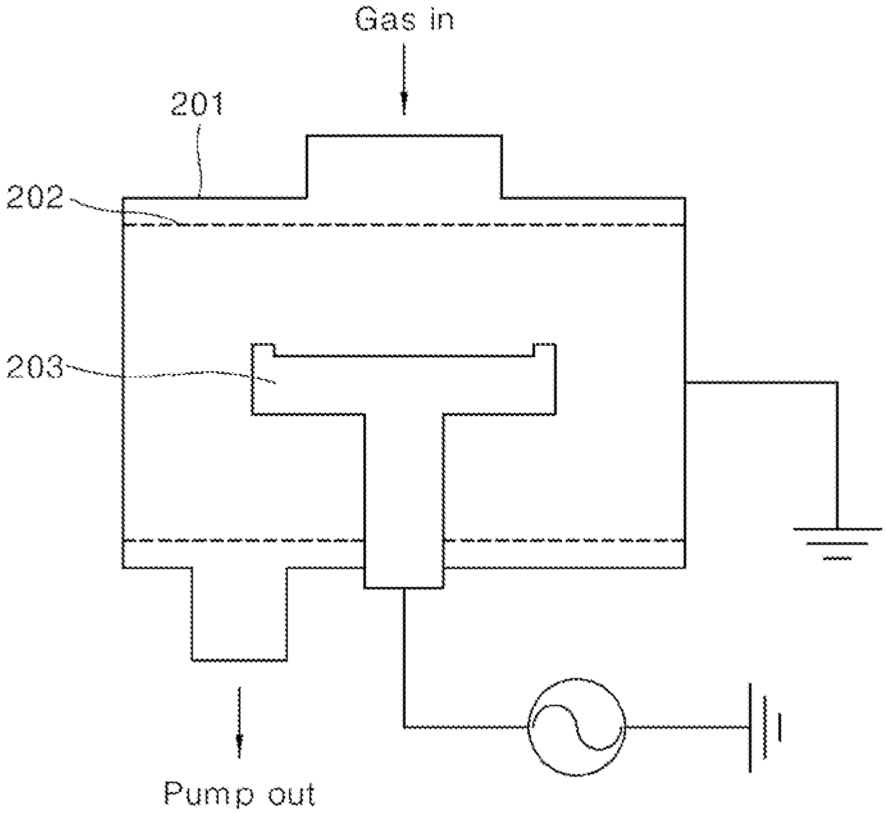
FIG. 8 is a view showing that the protective layer is removed by a second etching material, for example.

Then the protective layer may be removed by a second etching material, as illustrated in FIG. 8. The second etching material may be a non-fluorine-based etching material. For example, in the case where the protective layer is a carbon containing thin layer such as an amorphous carbon layer, the second etching material may be an etching material containing oxygen exhibiting excellent reactivity with carbon.

EMBODIMENT

Hereafter, the configuration and operation of the subject matter of the present disclosure are described specifically with reference to preferred embodiments of the preset disclosure. However, the preferred embodiments are provided only as an example, and in any respect, the subject matter of the present disclosure is not interpreted as being limited by the examples. Particulars that is not described herein can be technically inferred by one skilled in the art. Therefore, description of the particulars is omitted.

1. Formation of Coating Layer and Evaluation of Properties Thereof

An amorphous carbon layer was used as a protective layer. The amorphous carbon layer may exhibit a lower etch rate than an oxide layer.

Table 1 shows conditions for depositing an amorphous carbon layer, which are provided in an experiment.

TABLE 1

| Conditions | Value |
|---|---|
| Raw material | $C_xH_y$ |
| Ar Flow rate | 2000~3000 sccm |
| He Flow rate | 200~500 sccm |
| Deposition pressure | 5~8 Torr |
| Plasma power | 1000~2500 W |
| Substrate temperature | 400~600° C. |

Table 2 shows properties of a protective layer, based on deposition conditions.

TABLE 2

| Category | | Example 1 | Example 2 | Example 3 |
|---|---|---|---|---|
| Flow rate | CxHy | 500 sccm | 250 sccm | 250 sccm |
| | He | 200 sccm | 200 sccm | 500 sccm |
| | Ar | 2200 sccm | 2200 sccm | 2400 sccm |
| Properties | Thickness of layer | 2886 Å | 2363 Å | 1987 Å |
| | Deposition rate | 82.4 Å/s | 67.5 Å/s | 56.8 Å/s |
| | Stress | 45.9 MPa | −110.6 MPa | −406.7 MPa |

Even if coating layers are formed with an identical deposition material (CxHy), a change in the flow rate of a deposition material significantly contributes to a change in the stress of a coating layer compared to a deposition rate. A coating layer of example 1 is a layer that has positive stress, i.e., tensile stress, and coating layers of examples 2 and 3 are layers that has negative stress, i.e., compressive stress.

Table 3 shows etch rates and selectivity, based on properties of coating layers. $NF_3$ was used to etch the coating layers.

TABLE 3

| Category | | Example 1 | Example 2 | Example 3 | Oxide layer |
|---|---|---|---|---|---|
| Properties | Thickness of layer | 2886 Å | 2363 Å | 1987 Å | 1171 Å |
| | Deposition rate | 82.4 Å/s | 67.5 Å/s | 56.8 Å/s | 14 Å/s |
| Etch rate | | 53.1 Å/s | 9.6 Å/s | 5.3 Å/s | 232.0 Å/s |
| Selectivity (Oxide layer/ amorphous carbon layer) | | 437% | 2417% | 4377% | — |

Referring to table 3, amorphous carbon layers of examples 1 to 3 have a much lower etch rate than a silicon oxide layer. While the etch rate of the silicon oxide layer is 232.0λ/s, the etch rates of the amorphous carbon layers are 5.3λ/s to 53.1λ/s. Etch selectivity that is a ratio between the two coating layers is 437%-4377%.

Additionally, the etch rates of the amorphous carbon layers of embodiments 2 and 3, having compressive stress, are much lower than the etch rate of the amorphous carbon layer of embodiment 1, having tensile stress, with respect to $NF_3$. Thus, to protect an apparatus from an etching material, the amorphous carbon layer having compressive stress is preferable.

The amorphous carbon layer having a low etch rate with respect to $NF_3$ prevents a reaction of fluorine by-products with a reaction chamber and a substrate heating device, in the step of $NF_3$ cleaning.

As described above, the method of protecting an apparatus according to the present disclosure involves forming a protective layer having a low etch rate with respect to a first etching material, and a seasoning layer suppressing the exposure of the protective layer, and in a step of cleaning with a first etching material, a reaction of the first etching material with components constituting an apparatus may be suppressed. As a result, the apparatus may be protected from the etching material.

The embodiments are described above with reference to a number of preferred embodiments. However, one having ordinary skill in the art can understand that numerous other modifications and equivalents can be drawn from the embodiments. Therefore, the scope of the right to the present disclosure is not limited by the embodiments, and a number of modifications and improvements, which made by one skilled in the art, based on the fundamental concept of the disclosure defined in the following section of claims, also belong to the scope of the right to the disclosure.

The invention claimed is:

1. A method of protecting an apparatus from an etching material, comprising:

(a) forming a protective layer on an exposed surface of an apparatus;

(b) forming a seasoning layer on the protective layer;

(c) performing a deposition process on a wafer that is inserted into the apparatus in which the protective layer and the seasoning layer are formed, thereby a deposition film being formed on the seasoning layer;

(d) removing the deposition film and the seasoning layer, with a first etching material; and (e) removing the protective layer, with a second etching material, wherein in the step (d), the protective layer suppresses contact of the first etching material with the exposed surface of the apparatus, and wherein an etch rate of the protective layer to the seasoning layer with respect to the first etching material is about ¼ or less.

2. The method of claim 1, wherein the first etching material is a fluorine-based etching material, and the protective layer is selected from an amorphous carbon layer, a boron-doped carbon layer, and a tungsten-doped carbon layer.

3. The method of claim 2, wherein the first etching material comprises $NF_3$ or HF.

4. The method of claim 1, wherein the second etching material is a non-fluorine-based etching material.

5. The method of claim 1, wherein the second etching material is an oxygen containing etching material.

6. The method of claim 1, wherein the step (e) comprises using oxygen plasma.

7. The method of claim 1, wherein the protective layer is a layer having compressive stress.

8. The method of claim 1, wherein the wafer processing in the step (c) comprises forming an oxide film, and the seasoning layer comprises an oxide.

9. The method of claim 1, wherein the deposition process is performed twice or greater.

* * * * *